United States Patent
Lee et al.

(10) Patent No.: US 10,804,412 B2
(45) Date of Patent: Oct. 13, 2020

(54) PEROVSKITE SOLAR CELL HAVING EXCELLENT STABILITY AND HIGH EFFICIENCY

(71) Applicants: Hyundai Motor Company, Seoul (KR); Kia Motors Corporation, Seoul (KR); Hanbat National University Industry-Academic Cooperation Foundation, Daejeon (KR)

(72) Inventors: Eun Yeong Lee, Seoul (KR); Mi Yeon Song, Seoul (KR); Sol Kim, Suwon-si (KR); Sang Hak Kim, Seoul (KR); Moon Jung Eo, Suwon-si (KR); Hyungjun Kim, Daejeon (KR); Jiwon Jeon, Wonju-si (KR); Taedaehyeong Eom, Wonju-si (KR); Ki Ha Hong, Daejeon (KR)

(73) Assignees: Hyundai Motor Company, Seoul (KR); Kia Motors Corporation, Seoul (KR); Hanbat National University Industry-Academic Cooperation Foundation, Daejeon (KR)

( * ) Notice: Subject to any disclaimer, the term of this patent is extended or adjusted under 35 U.S.C. 154(b) by 5 days.

(21) Appl. No.: 15/835,997

(22) Filed: Dec. 8, 2017

(65) Prior Publication Data
US 2018/0323317 A1    Nov. 8, 2018

(30) Foreign Application Priority Data
May 2, 2017    (KR) .......................... 10-2017-0056152

(51) Int. Cl.
*H01L 31/02* (2006.01)
*H01L 51/44* (2006.01)
*H01L 31/055* (2014.01)
*H01L 31/0224* (2006.01)
*H01L 51/00* (2006.01)
(Continued)

(52) U.S. Cl.
CPC .. *H01L 31/02021* (2013.01); *H01L 31/02008* (2013.01); *H01L 31/022425* (2013.01); *H01L 31/055* (2013.01); *H01L 51/005* (2013.01); *H01L 51/4226* (2013.01); *H01L 51/442* (2013.01); *H01L 2031/0344* (2013.01);
(Continued)

(58) Field of Classification Search
None
See application file for complete search history.

(56) References Cited

U.S. PATENT DOCUMENTS

2017/0243699 A1*    8/2017    Beaumont ........... H01L 51/4226

FOREIGN PATENT DOCUMENTS

KR    10-1430139 B1    8/2014

OTHER PUBLICATIONS

Jacobsson, "Exploration of the compositional space for mixed lead halogen perovskites for high efficiency solar cells", Energy Environ. Sci., 2016, 9, 1706-1724 (Year: 2016).*
(Continued)

*Primary Examiner* — Devina Pillay
(74) *Attorney, Agent, or Firm* — Morgan, Lewis & Bockius LLP

(57) ABSTRACT

Various aspects of the present invention are directed to providing a perovskite solar cell, and has a technical feature in that excellent stability and high efficiency are simultaneously secured by using a solid solution having a specific composition as a light absorber.

2 Claims, 8 Drawing Sheets

(51) Int. Cl.
*H01L 51/42* (2006.01)
*H01L 31/0256* (2006.01)

(52) U.S. Cl.
CPC .. *H01L 2251/305* (2013.01); *H01L 2251/306* (2013.01); *H01L 2251/308* (2013.01)

(56) References Cited

OTHER PUBLICATIONS

Pellet, Mixed-Organic-Cation Perovskite Photovoltaics for Enhanced Solar-Light Harvesting, Angew. Chem. Int. Ed. 2014, 53, 3151-3157 (Year: 2014).*

Noh, Chemical Management for Colorful, Efficient, and Stable Inorganic-Organic Hybrid Nanostructured Solar Cells, Nano Lett. 2013, 13, 1764-1769 (Year: 2013).*

* cited by examiner

PEROVSKITE SOLAR CELL HAVING EXCELLENT STABILITY AND HIGH EFFICIENCY

CROSS-REFERENCE TO RELATED APPLICATION

The present application claims priority to Korean Patent Application No. 10-2017-0056152, filed May 2, 2017, the entire contents of which is incorporated herein for all purposes by this reference.

BACKGROUND OF THE INVENTION

Field of the Invention

The present invention relates to a perovskite solar cell. The perovskite solar cell utilizes a solid solution having a specific light absorber composition, thus providing both excellent stability and high efficiency.

Description of Related Art

A perovskite solar cell refers to a solid-state solar cell based on a light absorber having a perovskite ($ABX_3$) structure.

The perovskite solar cell has such a high extinction coefficient that the perovskite solar cell can effectively absorb solar light even at a submicron thickness. Accordingly, the perovskite solar cell has recently attracted much attention due to good efficiency such as power conversion efficiency (PCE) that amounts to about 20%.

Most of the perovskite solar cells reported thus far use $MAPbI_3$ as a light absorber. However, it has been reported that the crystal structure of $MAPbI_3$ undergoes a reversible phase transition from tetragonal to cubic phase at about 55° C., which is the operating temperature range of a solar cell. This phase transition may adversely affect the light stability and heat stability of a solar cell.

Thus, recently, formamidinium-based lead halide perovskite ($FAPbI_3$) has been considered to be an alternative to $MAPbI_3$, due to, for example, but not limited to, the reduced band gap energy, long charge diffusion distance, and excellent light stability thereof. However, $FAPbI_3$ is a polymorph of a hexagonal non-perovskite phase which does not have photovoltaic performance and a trigonal perovskite phase which has photovoltaic performance. Unfortunately, $FAPbI_3$ undergoes a phase transition from trigonal phase to hexagonal phase at a low temperature range (such as −40° C. to 25° C.), and as a result, its photovoltaic performance decreases and/or disappears.

In order to stabilize $FAPbI_3$, a mixed cation and/or halide system such as $(FAPbI_3)_x(MAPbBr_3)_{1-x}$ has been proposed. However, mixing with a bromine ion ($Br^-$) can creates additional problems related to phase dissociation or phase decomposition. For instance, phase dissociation or phase decomposition and mixing of a bromine ion ($Br^-$) can lead to loss of the low band gap. As such, there are limitations of using $FAPbI_3$ in a perovskite solar cell. Such a perovskite solar cell may not provide excellent stability and high efficiency as is needed.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a perovskite solar cell which is stable across a broad temperature range (e.g., −40° C. to 150° C.) and has high efficiency.

Specifically, various aspects of the present invention are directed to providing a specific composition of a light absorber that is included in a perovskite solar cell which is stable across a temperature range from about −40° C. to about 150° C. and has high efficiency.

The present invention, in various aspects, has also been made in an effort to provide a method capable of deriving a specific composition of a light absorber that is stable in a temperature range from about −40° C. to about 150° C., has low band gap energy, and does not undergo phase dissociation or phase decomposition.

The object of the present invention is not limited to the aforementioned object. The object of the present invention will be more apparent from the following description and will be realized by means described in the claims and by combinations thereof.

Various aspects of the present invention are directed to providing a perovskite solar cell containing a solid solution represented by the following Chemical Formula 1 as a light absorber.

$$(A1_{1-m}A2_m)M(X1_{1-n}X2_n)_3 \qquad \text{[Chemical Formula 1]}$$

In Chemical Formula 1, A1 is formamidinium (HC$(NH_2)_2^+$), A2 is methyl ammonium ($CH_3NH_3^+$), M is a divalent metal ion, X1 is an iodine ion ($I^-$), X2 is a bromine ion ($Br^-$), $0.2 \leq m \leq 0.7$, and $0 < n \leq 0.15$.

In various exemplary embodiments, $0.2 \leq m \leq 0.7$, and $0 < n \leq 0.15$ in Chemical Formula 1. In some cases, m can be 0.2, 0.7, or any number from 0.2 to 0.7, and n can be 0, 0.15, or any number from 0 to 0.15.

In other exemplary embodiments, $0.4 \leq m \leq 0.5$ and $0.04 \leq n \leq 0.07$ in Chemical Formula 1. In other words, m can be 0.4, 0.5, or any number from 0.4 to 0.5. For instance, m is a number equal to 0.4, a number between 0.4 and 0.5, or a number equal to 0.5. Also, n can be 0.04, 0.07, or any number from 0.04 to 0.07. For instance, n is a number equal to 0.04, a number between 0.04 and 0.07, or a number equal to 0.07.

In another exemplary embodiment of the present invention, m and n may satisfy the following Equation 1.

$$n = -0.01 + 0.56 \cdot \exp\left(-\frac{m^{0.82}}{0.23}\right) \qquad \text{[Equation 1]}$$

In various exemplary embodiments, the divalent metal ion may be selected from the group consisting of a divalent transition metal, a rare earth metal, an alkaline earth metal, lead (Pb), tin (Sn), germanium (Ge), gallium (Ga), indium (In), aluminium (Al), antimony (Sb), bismuth (Bi), polonium (Po), and a combination thereof.

In various exemplary embodiments, the solid solution may have a trigonal phase crystal structure at a temperature of about −40° C. to about 150° C. (e.g., about −40° C. to about 150° C., about −30° C. to about 150° C., about −20° C. to about 150° C., about −10° C. to about 150° C., about −5° C. to about 150° C., about 0° C. to about 150° C., about −40° C. to about 140° C., about −40° C. to about 130° C., about −40° C. to about 120° C., about −40° C. to about 110° C., about −30° C. to about 140° C., about −30° C. to about 130° C., about −30° C. to about 120° C., about −30° C. to about 110° C., about −20° C. to about 140° C., about −20° C. to about 130° C., about −20° C. to about 120° C., about −20° C. to about 110° C., and the like).

In still yet another exemplary embodiment, the solid solution does not undergo phase dissociation or phase decomposition at a temperature of −40° C. to 150° C. (e.g., about −40° C. to about 150° C., about −30° C. to about 150° C., about −20° C. to about 150° C., about −10° C. to about 150° C., about −5° C. to about 150° C., about 0° C. to about 150° C., about −40° C. to about 140° C., about −40° C. to about 130° C., about −40° C. to about 120° C., about −40° C. to about 110° C., about −30° C. to about 140° C., about −30° C. to about 130° C., about −30° C. to about 120° C., about −30° C. to about 110° C., about −20° C. to about 140° C., about −20° C. to about 130° C., about −20° C. to about 120° C., about −20° C. to about 110° C., and the like).

In various exemplary embodiments, the band gap energy (Eg) of the solid solution may satisfy the following Equation 2. In some cases, the solid solution has a band gap energy (Eg) ranging from 1.4 eV to 1.5 eV (e.g., 1.4 eV, 1.40 eV, 1.41 eV, 1.42 eV, 1.43 eV, 1.44 eV, 1.45 eV, 1.46 eV, 1.47 eV, 1.48 eV, 1.49 eV, or 1.5 eV).

$$Eg = 1.61 - 1.32 \cdot m + 5.48 \cdot m^2 - 13.13 \cdot m^3 + 18.11 \cdot m^4 - 13.00 \cdot m^5 + 3.74 \cdot m^6 \quad \text{[Equation 2]}$$

In other exemplary embodiments, the solid solution has a band gap energy (Eg) of 1.47 eV or less (e.g., 1.47 eV, 1.46 eV, 1.45 eV, 1.44 eV, 1.43 eV, 1.42 eV, 1.41 eV, 1.40 eV).

In various exemplary embodiments, in Chemical Formula 1, M may be lead (Pb), m=0.45 (m is equal to 0.45), and n=0.05 (n is equal to 0.05), and the solid solution may have a trigonal phase crystal structure at a temperature ranging from −40° C. to 150° C., and may not undergo phase dissociation or phase decomposition, and may have a band gap energy of 1.47 eV or less.

In other exemplary embodiments, the perovskite solar cell may include: a first electrode; an electron transporting layer formed on the first electrode; a light absorbing layer comprising the light absorber; a hole transporting layer formed on the light absorbing layer; and a second electrode formed on the hole transporting layer.

The present invention uses a solid solution having a specific composition, which maintains a crystal structure exhibiting photovoltaic performance as a light absorber even in a low temperature region, and thus may provide a perovskite solar cell which is stable in an extensive temperature region, and shows high efficiency.

The present invention also suggests a specific composition of a solid solution which does not undergo phase dissociation or phase decomposition when a bromine ion (Br⁻) is added in order to lower or adjust the band gap energy, and thus may provide a perovskite solar cell showing a higher efficiency.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
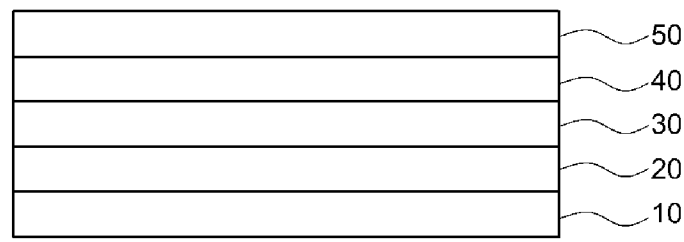
FIG. 1 schematically illustrates a perovskite solar cell according to an exemplary embodiment of the present invention.

Reference numerals set forth in the Drawings includes reference to the following elements as further discussed below:

10: first electrode
20: electron transporting layer
30: light absorbing layer
40: hole transporting layer
50: second electrode It should be understood that the appended drawings are not necessarily to scale, presenting a somewhat simplified representation of various preferred features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter reference will now be made in detail to various embodiments of the present invention, examples of which are illustrated in the accompanying drawings and described below. While the invention will be described in conjunction with exemplary embodiments, it will be understood that present description is not intended to limit the invention to those exemplary embodiments. On the contrary, the invention is intended to cover not only the exemplary embodiments, but also various alternatives, modifications, equivalents and other embodiments, which may be included within the spirit and scope of the invention as defined by the appended claims.

Hereinafter, the present invention will be described in detail through Examples. The Examples of the present invention may be modified in various forms as long as the gist of the invention is not changed. However, the right scope of the present invention is not limited to the following Examples.

If it is judged that publicly known configurations and functions may obscure the gist of the present invention, the description on the publicly known configurations and functions will be omitted.

The term "including" in the present specification means further including other constituent elements unless otherwise specifically described.

FIG. 1 is a view schematically illustrating a perovskite solar cell according to an exemplary embodiment of the present invention. The perovskite solar cell may include a first electrode 10, an electron transporting layer 20 formed on the first electrode 10, a light absorbing layer 30 formed on the electron transporting layer 20 and including a light absorber, a hole transporting layer 40 formed on the light absorbing layer 30, and a second electrode 50 formed on the hole transporting layer 40.

The first electrode 10 may be a transparent substrate comprising a transparent electrode, but any substrate may be used as long as the substrate is typically used in the solar cell field. For example, the transparent electrode may be fluorine doped tin oxide (FTO), indium doped tin oxide (ITO), zinc oxide (ZnO), carbon nanotubes, graphene, and the like, and the transparent substrate may be a glass substrate or a substrate including polyethylene terephthalate, polyethylene naphthalate, polyimide, and the like.

The electron transporting layer 20 may be formed in any configuration and form as long as electrons may smoothly move, but may be preferably formed of a porous layer composed of metal oxide particles, such as titanium dioxide ($TiO_2$).

The light absorbing layer 30 may contain an organic and inorganic complex perovskite as a light absorber. The light absorber may be a solid solution having a specific composition, which maintains a crystal structure in an extensive temperature region, does not undergo phase dissociation or phase decomposition, and has a low band gap energy, so that a detailed description thereof will be described below.

The hole transporting layer 40 may be formed for the purpose of reducing the oxidized light absorbing layer 30, but is not limited thereto. The hole transporting layer may include a single molecule hole transporting material or a polymer hole transporting material, and any material may be used as long as the material is typically used in the solar cell field. For example, as the single molecule hole transporting material, 2,2',7,7'-tetrakis(N,N-p-dimethoxy-phenylamino)-9,9'-spirobifluorene (spiro-MeOTAD) may be used, and as the polymer hole transporting material, poly(3-hexylthiophene) (P3HT), polytriarylamine (PTAA), or poly(3,4-ethylenedioxythiophene) polystyrene sulfonate (PEDOT:PSS) may be used.

Any material may be used as long as the second electrode 50 is typically used as a counter electrode of the first electrode in the solar cell field. For example, the material may be gold, silver, platinum, palladium, copper, aluminum, carbon, cobalt sulfide, copper sulfide, nickel oxide, and the like.

A perovskite solar cell according to an exemplary embodiment of the present invention may contain a solid solution represented by the following Chemical Formula 1 as a light absorber.

$$(A1_{1-m}A2_m)M(X1_{1-n}X2_n)_3 \quad \text{[Chemical Formula 1]}$$

In various exemplary embodiments, A1 is formamidinium ($HC(NH_2)_2^+$), A2 is methyl ammonium ($CH_3NH_3^+$), M is a divalent metal ion, X1 is an iodine ion ($I^-$), and X2 is a bromine ion ($Br^-$).

In particular, $0.2 \leq m \leq 0.7$. For instance, m is 0.2, 0.7 or a number ranging from 0.2 to 0.7. In some cases, $0.4 \leq m \leq 0.5$, or in other words, m is 0.4, 0.5 or a number ranging from 0.4 to 0.5. In various exemplary embodiments, $0 < n \leq 0.15$, or in other words, n is greater than 0 and less than 0.15, or 0.15. In some cases, $0.04 \leq n \leq 0.07$, or in other words, n is 0.04, 0.07, or a number ranging from 0.04 to 0.07.

Hereinafter, in Chemical Formula 1, the terms "$A1_{1-m}A2_m$", "M", and "$X1_{1-n}X2_n$" refer to "A-site", "B-site", and "X-site", respectively. However, "$A1_{1-m}A2_m$" and "A-site", "M" and "B-site", and "$X1_{1-n}X2_n$" and "X-site" may also be used together for the convenience of description. Since a perovskite material used as a light absorber in a solar cell is commonly represented by $ABX_3$, a person skilled in the art will clearly know what the aforementioned terms refer to in an exemplary embodiment of the present invention even though the terms are used together.

In Chemical Formula 1, "m" refers to "a ratio of methyl ammonium (MA), and "n" refers to "a ratio of a bromine ion ($Br^-$)". However, for the convenience of description, "m" and "a ratio of methyl ammonium (MA)", and "n" and "a ratio of a bromine ion ($Br^-$)" may also be used together.

The solid solution means that two or more perovskite-structured organic-metal halides having different compositions form a solid solution phase.

Specifically, the present invention has a technical feature in that there is provided a light absorber which allows methyl ammonium lead bromide ($MAPbBr_3$) being the one organic-metal halide to be substituted with formamidinium lead iodide ($FAPbI_3$) being the other organic-metal halide, allows a ratio (m) of methyl ammonium (MA) substituted with A-site and a ratio (n) of a bromine ion ($Br^-$) substituted with X-site to be asymmetric, and thus is stable because the light absorber does not undergo phase transition, phase dissociation, and phase decomposition in an extensive temperature region (−40° C. to 150° C.) and has high efficiency due to the low band gap energy.

A solid solution having a specific composition represented by Chemical Formula 1 according to an exemplary embodiment of the present invention may maintain a trigonal phase capable of exhibiting photovoltaic performance in a broad temperature range such as from −40° C. to 150° C.

As described above, $FAPbI_3$ undergoes a phase transition from trigonal phase to hexagonal phase in a low temperature region (−40° C. to 25° C.), and thus has a problem in that photovoltaic performance disappears. The present invention has a technical feature in that the aforementioned problems are solved by forming a solid solution having a specific composition represented by Chemical Formula 1.

Figure 2:
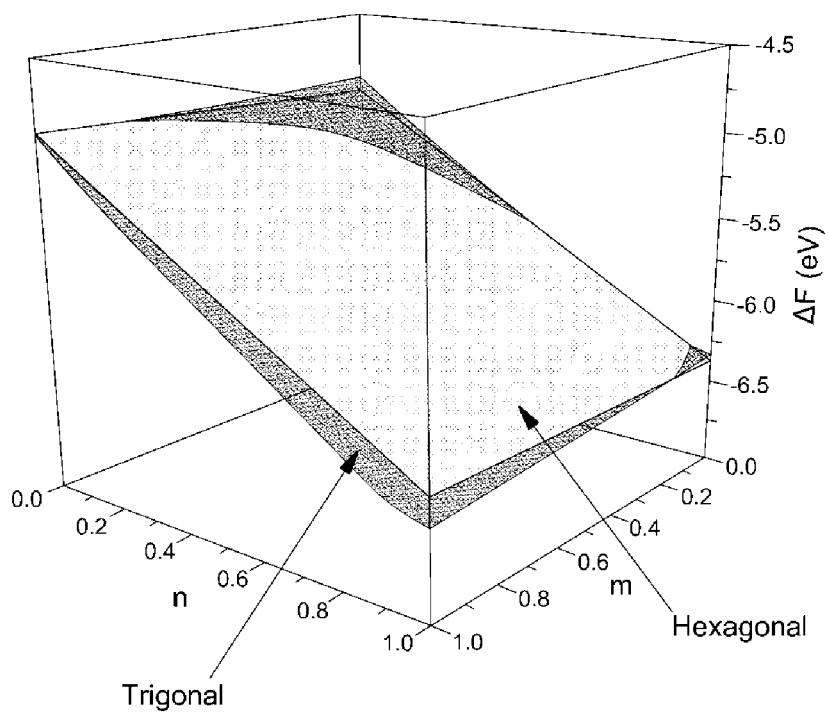
FIG. 2 is, when m and n are 0 to 1 for a solid solution represented by $(A1_{1-m}A2_m)M(X1_{1-n}X2_n)_3$, a view which calculates free energy in the case where the solid solution corresponding to each composition is a trigonal phase and free energy in the case where the solid solution corresponding to each composition is a hexagonal phase.

FIG. 2 is, when m and n are 0 to 1 for a solid solution represented by $(A1_{1-m}A2_m)M(X1_{1-n}X2_n)_3$, a view which calculates free energy (blue surface, trigonal) in the case where the solid solution corresponding to each composition is a trigonal phase and a free energy (red surface, hexagonal) in the case where the solid solution corresponding to each composition is a hexagonal phase. In FIG. 2, when the free energy in the case of a trigonal phase is lower than that in the case of a hexagonal phase, the solid solution can be said to have a trigonal phase crystal structure.

Figure 3:
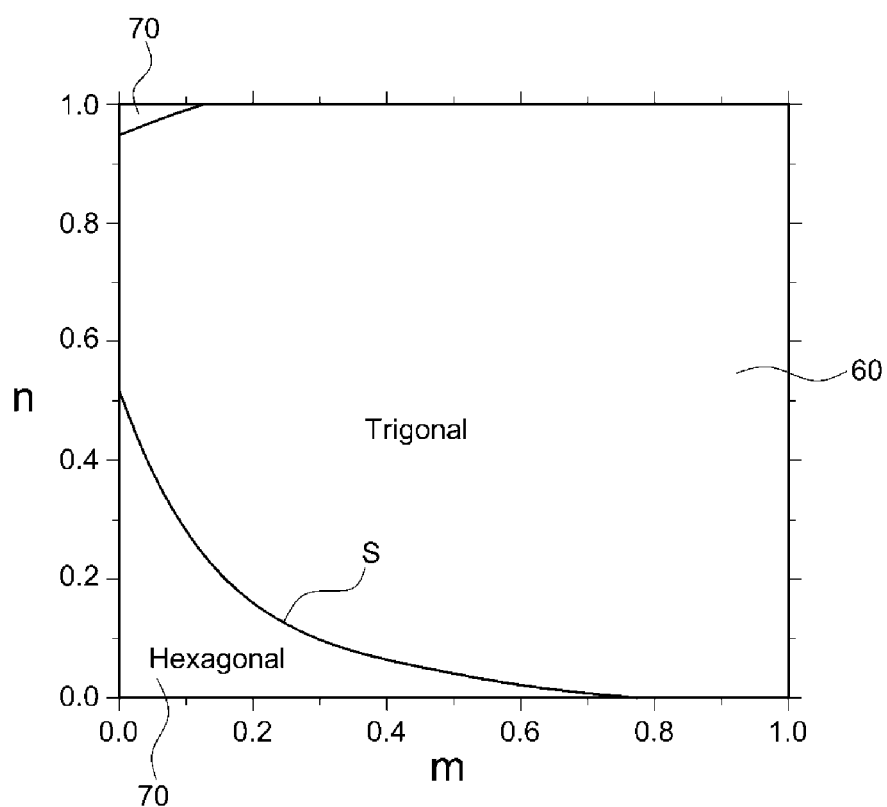
FIG. 3 is a view which differentiates a ratio (m) of methyl ammonium (MA) into a ratio of a bromine ion (Br⁻) when the trigonal phase is stable, and a ratio (m) of methyl ammonium (MA) into a ratio of bromine ion (Br⁻) when the hexagonal phase is stable.

Since it is possible to differentiate a ratio (m) of methyl ammonium (MA) into a ratio of bromine ions (Br⁻) when the trigonal phase is stable, and a ratio (m) of methyl ammonium (MA) into a ratio of bromine ion (Br⁻) when the hexagonal phase is stable through FIG. 2, a two-dimensional expression of the same is illustrated in FIG. 3.

According to FIG. 3, when m and n in Chemical Formula 1 correspond to a trigonal region 60, the solid solution has a trigonal phase crystal structure capable of exhibiting photovoltaic performance, and when m and n in Chemical Formula 1 correspond to a hexagonal region 70, the solid solution has a hexagonal phase crystal structure in which photovoltaic performance is lost.

In FIG. 3, a mathematic expression of an S curved line being a line which extends m and n belonging to critical values of the trigonal region 60 is shown in the following Equation 1.

$$n = -0.01 + 0.56 \cdot \exp\left(-\frac{m^{0.82}}{0.23}\right)$$ [Equation 1]

Meanwhile, when the following Vegard's law is applied, it is possible to calculate the band gap energy (Eg) of the solid solution according to the ratio (m) of methyl ammonium (MA) and the ratio (n) of a bromine ion (Br⁻).

$$E_{gFA_{1-m}MA_mPb(I_{1-n}Br_n)_3} = (1-m)\cdot(1-n)\cdot E_{gFAPbI_3} + (1-m)\cdot n \cdot E_{gFAPbBr_3} + m\cdot(1-n)\cdot E_{gMAPbI_3} + m\cdot n \cdot E_{gMAPbBr_3}$$

Figure 4:
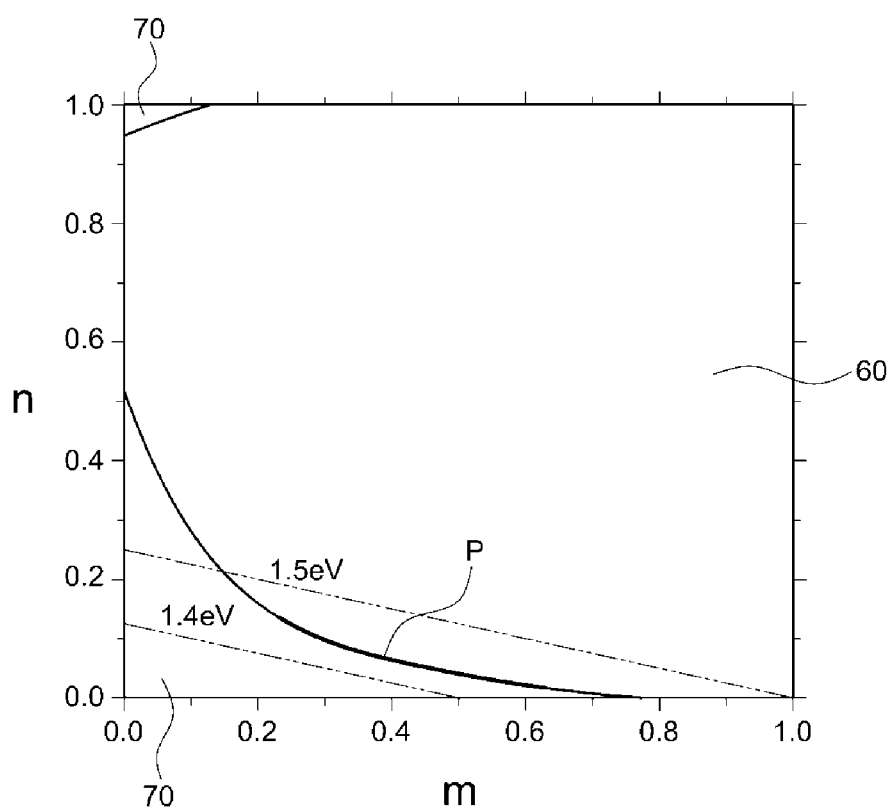
FIG. 4 is a view which expresses a specific composition (m, n) of a solid solution having a band gap energy of 1.4 eV and 1.5 eV on FIG. 3.

FIG. 4 is a view which expresses a specific composition (m, n) of the solid solution having a band gap energy of 1.4 eV and 1.5 eV on FIG. 3. m and n may be calculated according to the Vegard's law.

Referring to FIG. 4, when m and n belong to a P region, it can be seen that the solid solution may maintain a trigonal phase crystal structure which exhibits photovoltaic performance without undergoing phase transition, and has low band gap energy, and thus may secure high efficiency.

That is, the present invention has a technical feature in that m and n are critical values of the trigonal region 60, in which the solid solution may maintain a trigonal phase, and the band gap energy (Eg) calculated according to the Vegard's law belongs to a P region which is 1.5 eV or less, specifically, about 1.47 eV or less.

Specifically, since m and n satisfy Equation 1, the solid solution has a trigonal phase crystal structure, satisfies a range of 0.2≤m≤0.7 and 0<n≤0.15, and thus has a low band gap energy.

Figure 5:
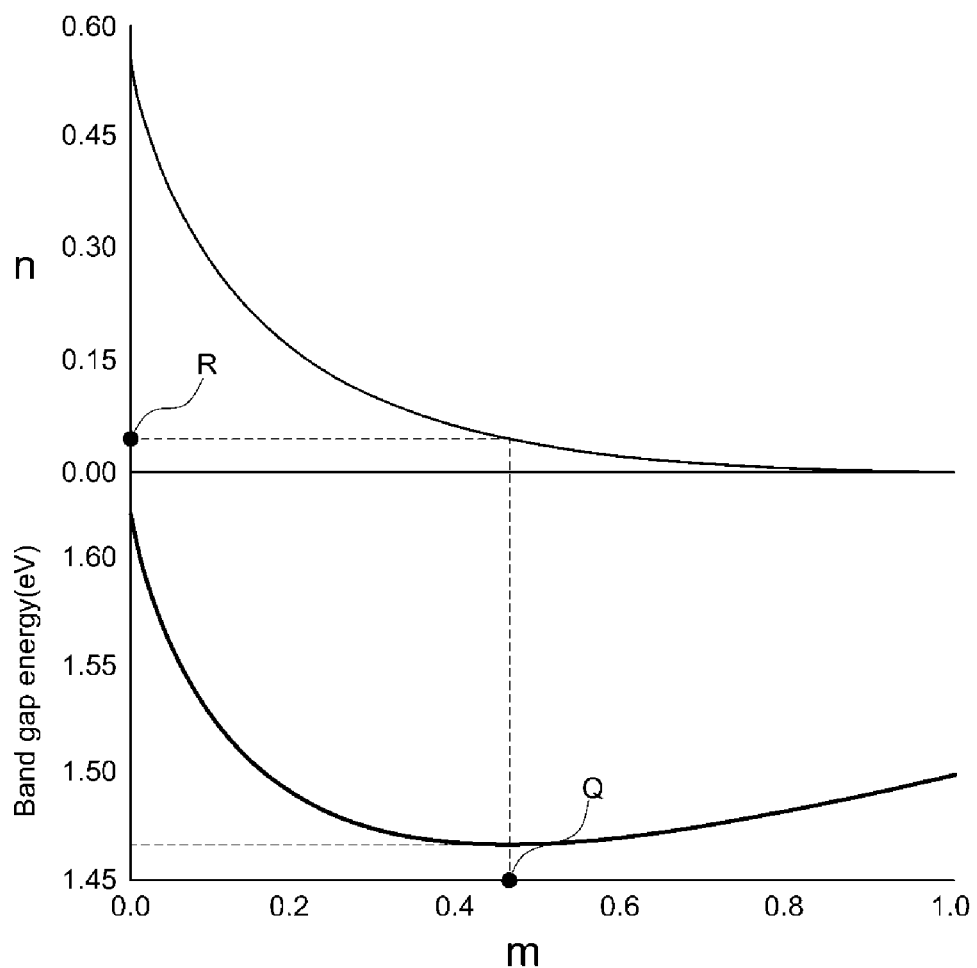
FIG. 5 is a graph illustrating both Equation 1 (a function of m and n) and Equation 2 (a function of m and a band gap energy)

The same may also be described as illustrated in FIG. 5. FIG. 5 is a graph illustrating both Equation 1 (a function of m and n) and Equation 2 (a function of m and a band gap energy).

The following Equation 2 shows a band gap energy (Eg) calculated according to the Vegard's law by using the ratio (m) of methyl ammonium (MA) and the ratio (n) of a bromine ion (Br⁻), which satisfy Equation 1, as a function of a ratio (m) of methyl ammonium (MA).

$$Eg = 1.61 - 1.32 \cdot m + 5.48 \cdot m^2 - 13.13 \cdot m^3 + 18.11 \cdot m^4 - 13.00 \cdot m^5 + 3.74 \cdot m^6$$ [Equation 2]

Through FIG. 5, it is possible to derive a composition of a solid solution having a phase stability and a maximum efficiency. When the band gap energy of the solid solution is the lowest which is about 1.47 eV, the ratio (m) of methyl ammonium (MA) is 0.45 (Q). When the ratio (m) of methyl ammonium (MA) is 0.45, the ratio (n) of a bromine ion (Br⁻) needs to be 0.05, such that the solid solution has a trigonal phase crystal structure. That is, when a solid solution represented by the following Chemical Formula 2 is used as a light absorber, it is possible to obtain a perovskite solar cell having the best stability and showing the highest efficiency.

(FA$_{0.55}$MA$_{0.45}$)Pb(I$_{0.95}$Br$_{0.05}$)$_3$ [Chemical Formula 2]

Through FIG. 5, it is also possible to derive a composition of a solid solution having desired band gap energy and a desired absorption wavelength. This is because it is possible to derive a ratio (m) of methyl ammonium (MA), which is capable of implementing a specific band gap energy value through Equation 2 of FIG. 5, and once the ratio (m) of methyl ammonium (MA) is determined, when the ratio (m) of methyl ammonium (MA) is a specific value through Equation 1, it is possible to find out a ratio (n) of a bromine ion (Br⁻), which is capable of maintaining a phase stability.

Therefore, according to an exemplary embodiment of the present invention, even though the absorption wavelength varies in accordance with the environment, purpose, and the like in which a perovskite solar cell is used, a solar cell having excellent stability and high efficiency may be provided by flexibly adjusting the composition of the solid solution.

Meanwhile, even though an effect of excellent phase stability and high efficiency is implemented by adjusting the ratio (m) of methyl ammonium (MA) and the ratio of a bromine ion (Br⁻) as described above, the effect may not be properly exhibited when phase dissociation or phase decomposition occurs.

Figure 6:
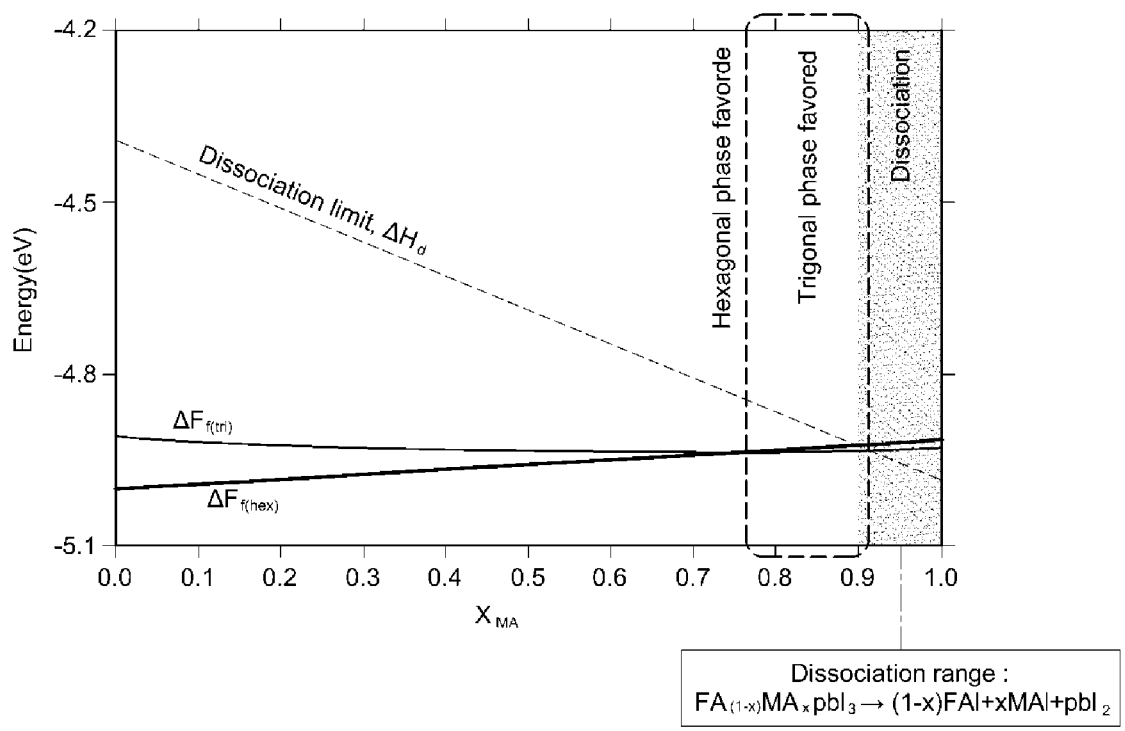
FIG. 6 is a view illustrating a region in which a solid solution undergoes phase dissociation via an enthalpy formed when methyl ammonium (MA) is substituted with A-site.

However, through a calculation via an enthalpy formed when methyl ammonium (MA) is substituted with A-site, it can be seen that phase dissociation occurs only when the methyl ammonium (MA) is substituted at a ratio of about 0.9 or more, as illustrated in FIG. 6.

Since the solid solution represented by Chemical Formula 1 according to an exemplary embodiment of the present invention has a range of 0.2≤m≤0.7, specifically, 0.4≤m≤0.5, and 0<n≤0.15, specifically, 0.04≤n≤0.07, it can be seen that phase dissociation does not occur.

Figure 7:
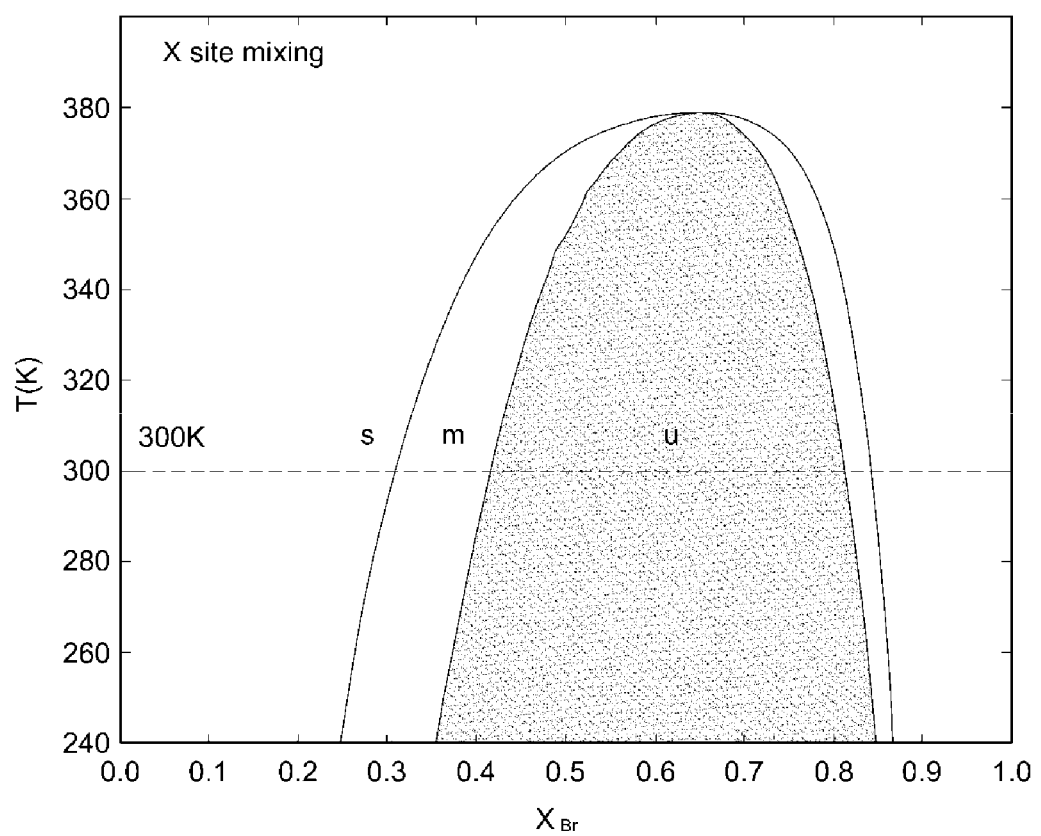
FIG. 7 is a view illustrating a region in which a solid solution undergoes phase decomposition in an absolute temperature range of 240 K to 380 K when a bromine ion (Br⁻) is only substituted with X-site without any substitution of the A-site.

FIG. 7 is a view illustrating a region in which the solid solution undergoes phase decomposition in an absolute temperature range of 240 K to 380 K when a bromine ion (Br⁻) is only substituted with X-site without any substitution of the A-site. In FIG. 7, s, m, and u mean a stable state, a metastable state, and an unstable state, respectively, and the metastable state and unstable state of the solid solution mean that phase decomposition occurs.

Referring to FIG. 7, it can be seen that in the case where a bromine ion (Br⁻) is substituted with X-site without any substitution of A-site, phase decomposition occurs when the ratio (n) of a bromine ion (Br⁻) is between 0.3 and 0.8 at an absolute temperature of 300 K, and phase decomposition occurs when the ratio (n) of a bromine ion (Br⁻) is between 0.25 and 0.85 at an absolute temperature of 240 K.

Figure 8:
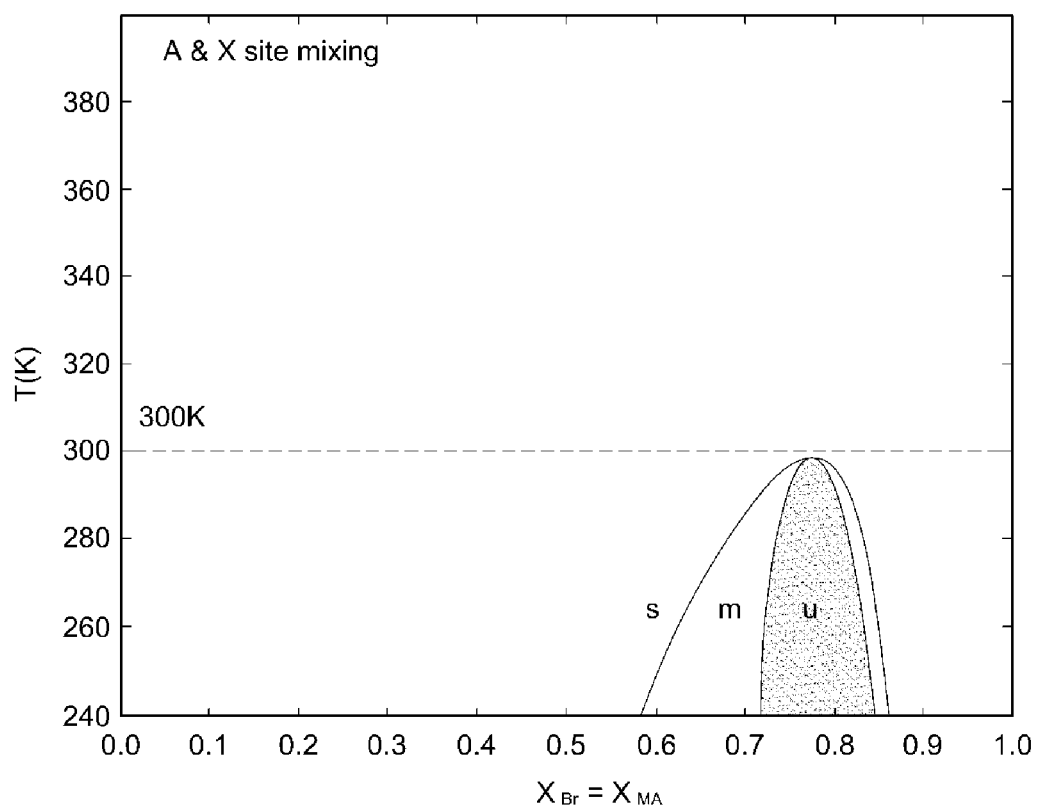
FIG. 8 illustrates a region in which a solid solution undergoes phase decomposition in an absolute temperature range of 240 K to 380 K when methyl ammonium (MA) is substituted with A-site, a bromine ion (Br⁻) is substituted with X-site, and the ratios (m, n) are made to be the same as each other.

FIG. 8 illustrates a region in which the solid solution undergoes phase decomposition in an absolute temperature range of 240 K to 380 K when methyl ammonium (MA) is substituted with A-site, a bromine ion (Br⁻) is substituted with X-site, and the ratios (m, n) are made to be the same as each other. In FIG. 8, s, m, and u mean a stable state, a metastable state, and an unstable state, respectively, and the metastable state and unstable state of the solid solution mean that phase decomposition occurs.

Referring to FIG. 8, it can be seen that in the case where A-site and X-site are substituted at the same ratio, phase decomposition occurs when the ratio (m) of methyl ammonium (MA) and the ratio (n) of a bromine ion (Br⁻) are between 0.6 and 0.85 at an absolute temperature of 240 K.

Figure 9:
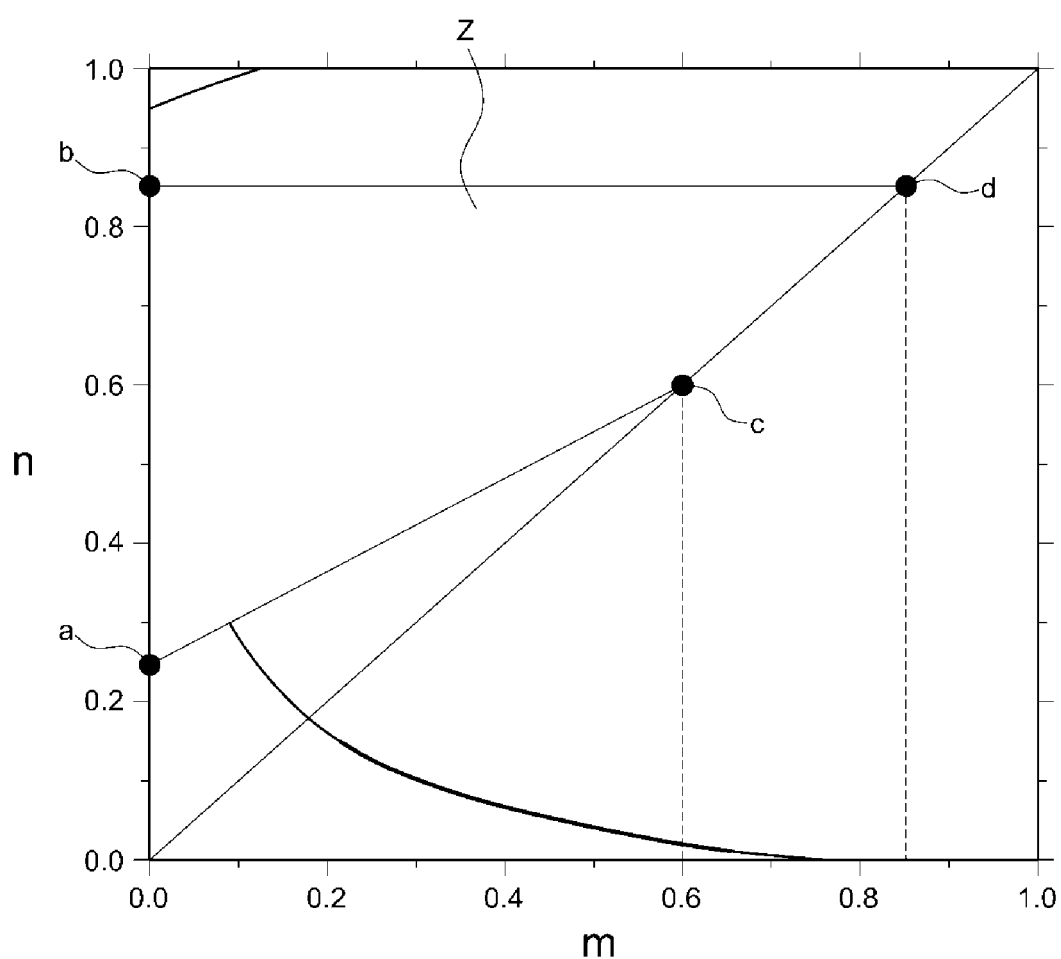
FIG. 9 is a view illustrating a region of the ratio (m) of methyl ammonium (MA) and the ratio (n) of a bromine ion (Br⁻), in which a solid solution undergoes phase decomposition at an absolute temperature of 300 K or less.

FIG. 9 is a view illustrating a region of the ratio (m) of methyl ammonium (MA) and the ratio (n) of a bromine ion (Br⁻), in which a solid solution undergoes phase decomposition at an absolute temperature of 300 K or less.

Specifically, according to FIG. 7, when the ratio of methyl ammonium (MA) is 0 (in the case where methyl ammonium is not substituted with A-site), it was expressed that phase decomposition occurs in the case where the ratio (n) of a bromine ion (Br⁻) is 0.25 to 0.85 (the a-b interval in FIG. 9). Furthermore, according to FIG. 8, it was expressed that phase decomposition occurs in the case where the ratio (m) of methyl ammonium (MA) and the ratio (n) of a bromine ion (Br⁻) are 0.6 to 0.85 (the c-d interval in FIG. 9).

Therefore, referring to FIG. 9, it can be seen that the solid solution undergoes phase decomposition when the ratio (m) of methyl ammonium (MA) and the ratio (n) of a bromine ion (Br⁻) belong to a Z region which connects a, b, c, and d in a low temperature region of an absolute temperature of 300 K or less.

Since the solid solution represented by Chemical Formula 1 according to an exemplary embodiment of the present invention has a composition of a P region as described above, and does not belong to the Z region, it can be seen that phase decomposition does not occur even in a low temperature region of an absolute temperature of 300 K or less.

Since the solid solution represented by the following Chemical Formula 1 according to an exemplary embodiment of the present invention may maintain a trigonal phase crystal structure which exhibits photovoltaic performance in an extensive temperature region of −40° C. to 150° C. as described above, and does not undergo phase dissociation or phase decomposition in the same temperature region, the solid solution has excellent stability and high efficiency due to the band gap energy of about 1.47 eV or less, and as a result, when the solid solution is used as a light absorber, it is possible to obtain a perovskite solar cell having excellent stability and high efficiency.

$(A1_{1-m}A2_m)M(X1_{1-n}X2_n)_3$      [Chemical Formula 1]

In Chemical Formula 1, A1 is formamidinium (HC(NH₂)₂⁺), A2 is methyl ammonium (CH₃NH₃⁺), M is a divalent metal ion, X1 is an iodine ion (I⁻), X2 is a bromine ion (Br⁻), 0.2≤m≤0.7, 0<n≤0.15, and m and n satisfy the following Equation 1.

$$n = -0.01 + 056 \cdot \exp\left(-\frac{m^{0.82}}{0.23}\right)$$      [Equation 1]

The Test Examples and Examples of the present invention have been described in detail as described above, but the right scope of the present invention is not limited to the above-described Test Examples and Examples, and various modifications and improvements by the person skilled in the art using the basic concepts of the present invention defined in the following claims also fall within the right scope of the present invention.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A perovskite solar cell containing a solid solution represented by the following Chemical Formula 1 as a light absorber:

$(A1_{1-m}A2_m)M(X1_{1-n}X2_n)_3$      [Chemical Formula 1]

wherein A1 is formamidinium (HC(NH₂)₂⁺) and A2 is methyl ammonium (CH₃NH₃⁺);
M is lead (Pb);
X1 is an iodine ion (I⁻) and X2 is a bromine ion (Br⁻);
wherein m is 0.45, n is 0.05, and n satisfies the following Equation 1 so that the solid solution has a trigonal crystal structure at a temperature of about −40° C. to about 25° C., and has a band gap energy (Eg) of 1.4 eV to 1.47 eV:

$$n = -0.01 + 056 \cdot \exp\left(-\frac{m^{0.82}}{0.23}\right),$$      [Equation 1]

wherein the solid solution does not undergo phase dissociation or phase decomposition at a temperature of about −40° C. to about 25° C.

2. The perovskite solar cell of claim 1, wherein the perovskite solar cell comprises:
a first electrode;
an electron transporting layer formed on the first electrode;
a light absorbing layer comprising the light absorber;
a hole transporting layer formed on the light absorbing layer; and
a second electrode formed on the hole transporting layer.

* * * * *